(12) United States Patent
Chen et al.

(10) Patent No.: US 10,203,577 B2
(45) Date of Patent: Feb. 12, 2019

(54) ACTIVE ELEMENT ARRAY SUBSTRATE AND DISPLAY PANEL

(71) Applicant: Innolux Corporation, Miao-Li County (TW)

(72) Inventors: Te-Yi Chen, Miao-Li County (TW); Han-Tsung Su, Miao-Li County (TW); Hsin-Hung Lin, Miao-Li County (TW); Ker-Yih Kao, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 38 days.

(21) Appl. No.: 15/434,070

(22) Filed: Feb. 16, 2017

(65) Prior Publication Data
US 2017/0235172 A1   Aug. 17, 2017

(30) Foreign Application Priority Data
Feb. 17, 2016  (CN) .......................... 2016 1 0088989

(51) Int. Cl.
| | |
|---|---|
| H01L 29/45 | (2006.01) |
| H01L 29/66 | (2006.01) |
| G02F 1/1335 | (2006.01) |
| G02F 1/1343 | (2006.01) |
| G02F 1/1362 | (2006.01) |
| G02F 1/1368 | (2006.01) |
| H01L 29/786 | (2006.01) |

(52) U.S. Cl.
CPC ...... *G02F 1/1368* (2013.01); *G02F 1/134309* (2013.01); *G02F 1/136286* (2013.01); *H01L 29/45* (2013.01); *H01L 29/66969* (2013.01); *G02F 1/133512* (2013.01); *G02F 1/133514* (2013.01); *G02F 2001/134345* (2013.01); *G02F 2001/136236* (2013.01); *G02F 2001/136295* (2013.01); *G02F 2201/122* (2013.01); *G02F 2201/123* (2013.01); *H01L 29/786* (2013.01)

(58) Field of Classification Search
None
See application file for complete search history.

(56) References Cited

U.S. PATENT DOCUMENTS

| | | | | |
|---|---|---|---|---|
| 2012/0119211 | A1* | 5/2012 | Lin | ................... H01L 29/78606 257/57 |
| 2015/0108467 | A1* | 4/2015 | Moriguchi | .......... H01L 27/1225 257/43 |
| 2016/0252793 | A1* | 9/2016 | Cheng | ................... G02F 1/1362 257/72 |

* cited by examiner

*Primary Examiner* — Ryan Crockett
(74) *Attorney, Agent, or Firm* — JCIPRNET

(57) ABSTRACT

An active element array substrate including a substrate, a first metal layer, a first insulation layer, a semiconductor layer, a first patterned conductive layer, a second metal layer, a second insulation layer, and a second patterned conductive layer is provided. The semiconductor layer is disposed on the first insulation layer. The first patterned conductive layer is disposed on the first insulation layer and covers a partial region of the semiconductor layer. The second metal layer is disposed on the first patterned conductive layer. The second insulation layer is disposed on the second metal layer and covers at least a partial region of the second metal layer, the first patterned conductive layer, the semiconductor layer, and the first insulation layer. The second patterned conductive layer is disposed on the second insulation layer and overlapped with the first patterned conductive layer. A display panel is also provided.

18 Claims, 14 Drawing Sheets

ACTIVE ELEMENT ARRAY SUBSTRATE AND DISPLAY PANEL

CROSS-REFERENCE TO RELATED APPLICATION

This application claims the priority benefit of China application serial no. 201610088989.5, filed on Feb. 17, 2016. The entirety of the above-mentioned patent application is hereby incorporated by reference herein and made a part of this specification.

BACKGROUND

1. Field of the Invention

The present disclosure generally relates to an active element array substrate and a display panel.

2. Description of Related Art

In recent years, flat display panels that are characterized by low power consumption, favorable space utilization, absence of radiation, and high resolution have held the dominating position in the market, upon which the liquid crystal display (LCD) panel are the most popular. As display specifications continuous to develop towards large-scale, market demands on the performance of the liquid crystal display panels also develop towards characterises such as high contrast, fast response, wide viewing angle, and etc. Currently, the LCD panels that utilize common wide viewing angle technology include in-plane switching (IPS) LCD panel, multi-domain vertical alignment (MVA) LCD panel and fringe field switching (FFS) LCD panel.

SUMMARY

The disclosure provides an active element array substrate, which can be fabricated using a relatively small number of photomasks.

The disclosure provides a display panel with a relatively low fabrication cost.

An active element array substrate of the disclosure includes a substrate, a first metal layer, a first insulation layer, a semiconductor layer, a first patterned conductive layer, a second metal layer, a second insulation layer, and a second patterned conductive layer. The first metal layer is disposed on the substrate. The first insulation layer is located on the substrate and covers the first metal layer. The semiconductor layer is disposed on the first insulation layer. The first patterned conductive layer is disposed on the first insulation layer and covers a partial region of the semiconductor layer. The second metal layer is disposed on the first patterned conductive layer. The second insulation layer is disposed on the second metal layer and covers at least a partial region of the second metal layer, the first patterned conductive layer, the semiconductor layer, and the first insulation layer. The second patterned conductive layer is disposed on the second insulation layer and overlapped with the first patterned conductive layer.

A display panel of the disclosure includes an active element array substrate, an opposite substrate and a display medium layer. The active element array substrate includes a substrate, a first metal layer, a first insulation layer, a semiconductor layer, a first patterned conductive layer, a second metal layer, a second insulation layer, and a second patterned conductive layer. The first metal layer is disposed on the substrate. The first insulation layer is located on the substrate and covers the first metal layer. The semiconductor layer is disposed on the first insulation layer. The first patterned conductive layer is disposed on the first insulation layer and covers a partial region of the semiconductor layer. The second metal layer is disposed on the first patterned conductive layer. The second insulation layer is disposed on the second metal layer and coves at least a partial region of the second metal layer, the first patterned conductive layer, the semiconductor layer, and the first insulation layer. The second patterned conductive layer is disposed on the second insulation layer and overlapped with the first patterned conductive layer. The opposite substrate is opposite to the active element array substrate. The display medium layer is located between the active element array substrate and the opposite substrate.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It should be noted that the expression "a layer overlying another layer", "a layer is disposed above another layer", "a layer is disposed on another layer", "a layer is disposed over another layer", and "a layer is formed on another layer" may indicate that the layer is in direct contact with the other layer, or that the layer is not in direct contact with the other layer, there being one or more intermediate layers disposed between the layer and the other layer.

Figure 1A:
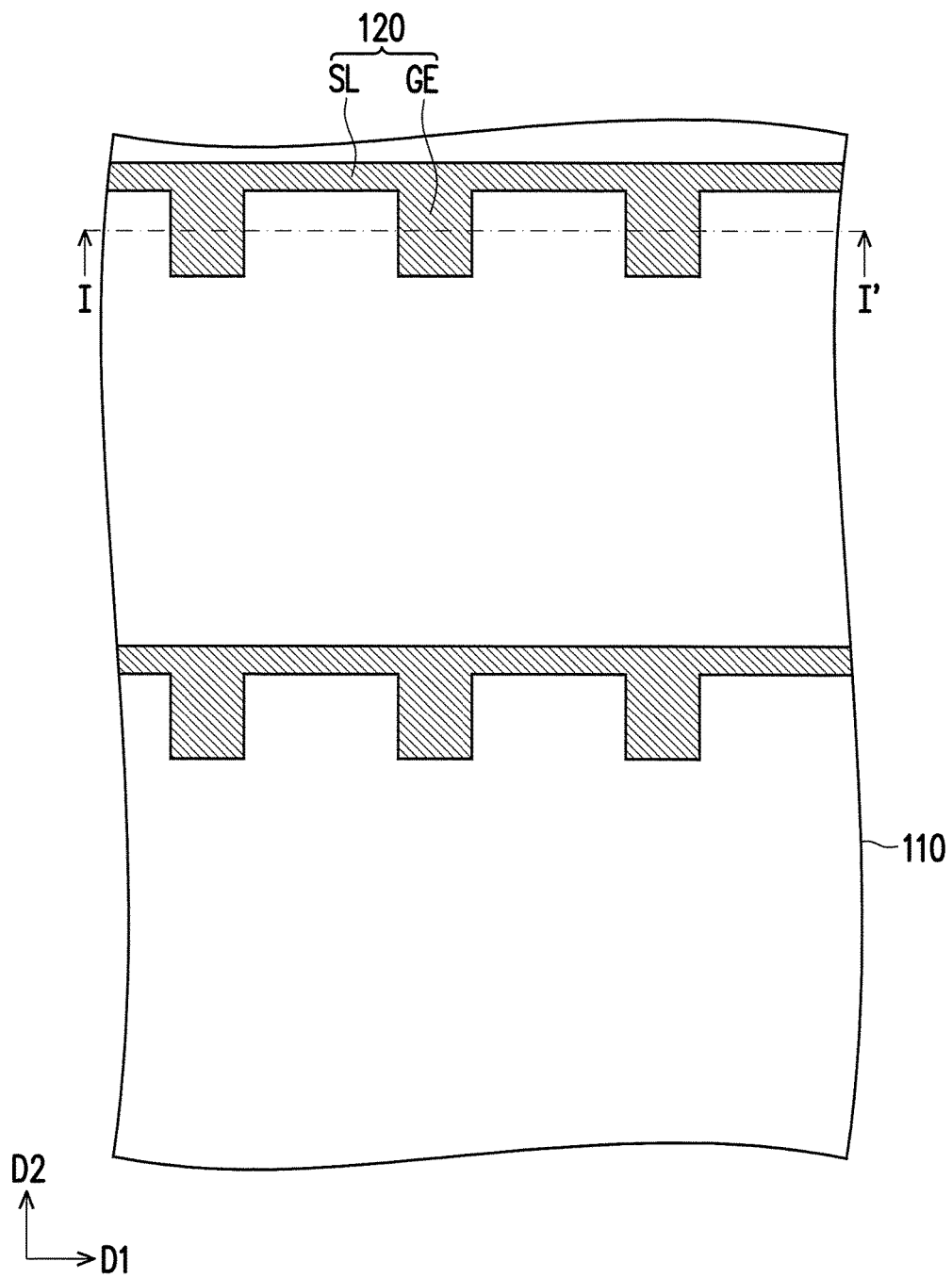
FIG. 1A through FIG. 1I are schematic partial top views illustrating a fabrication process of an active element array substrate according to a first embodiment of the disclosure.
Figure 1B:
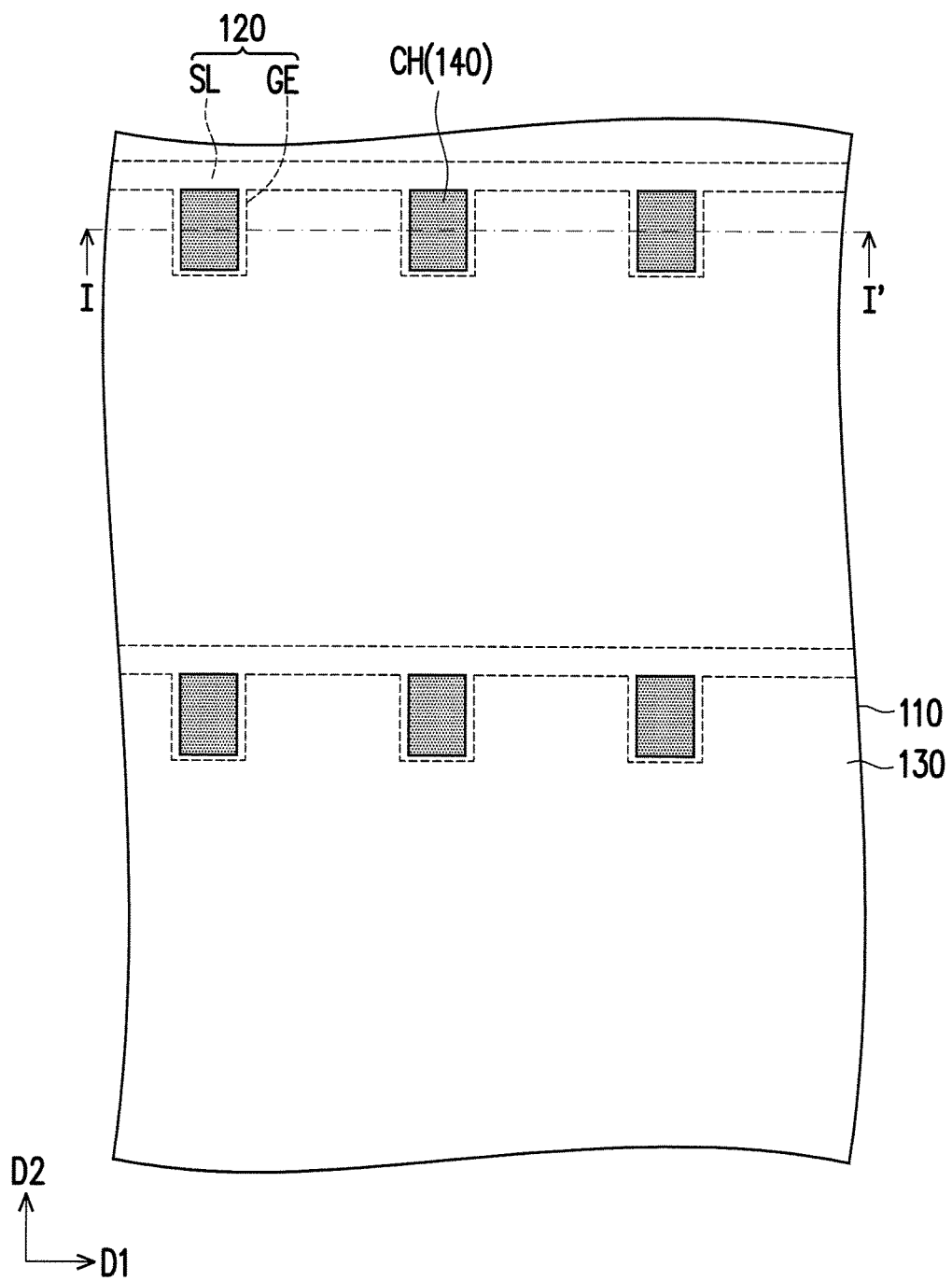
Figure 1C:
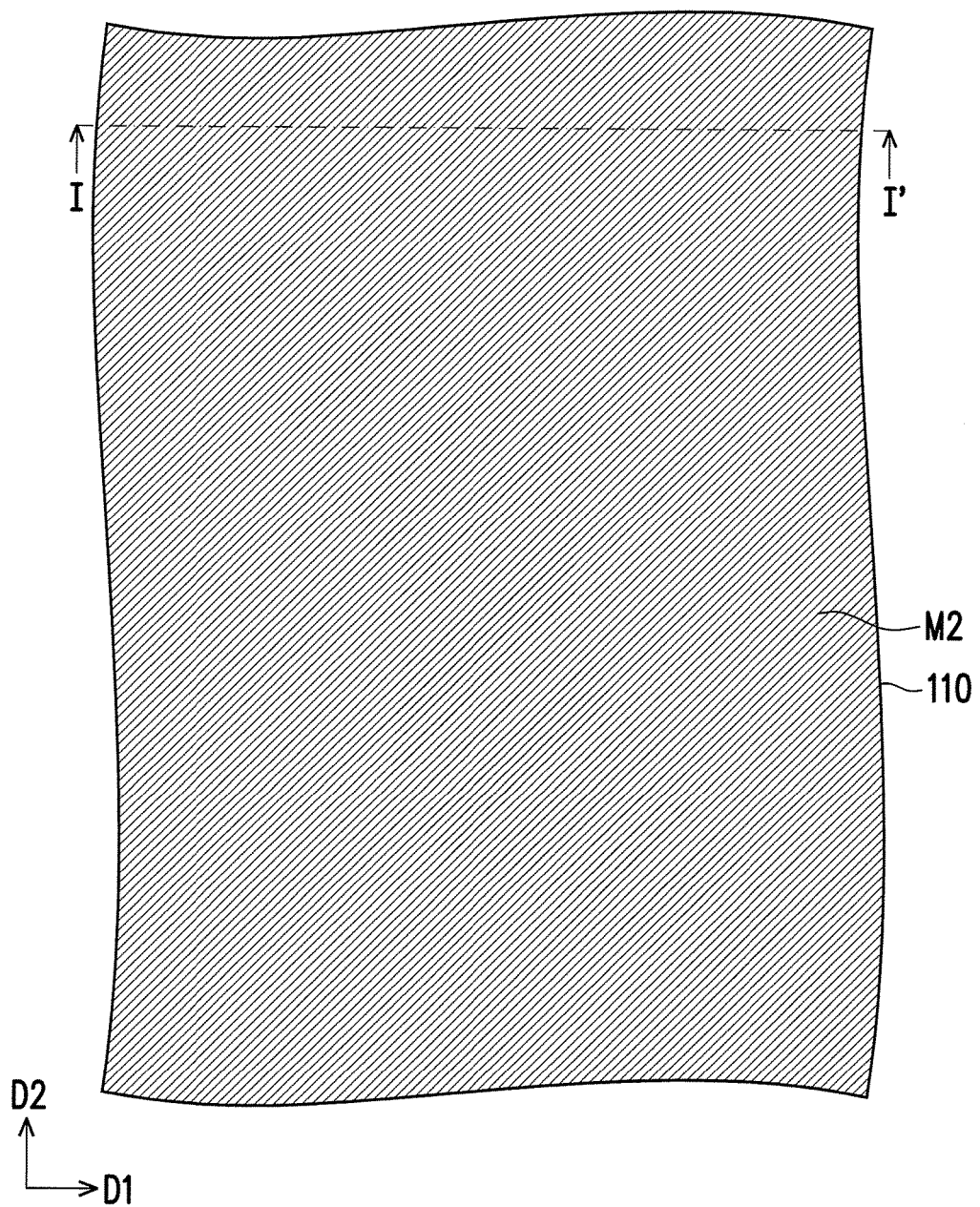
Figure 1D:
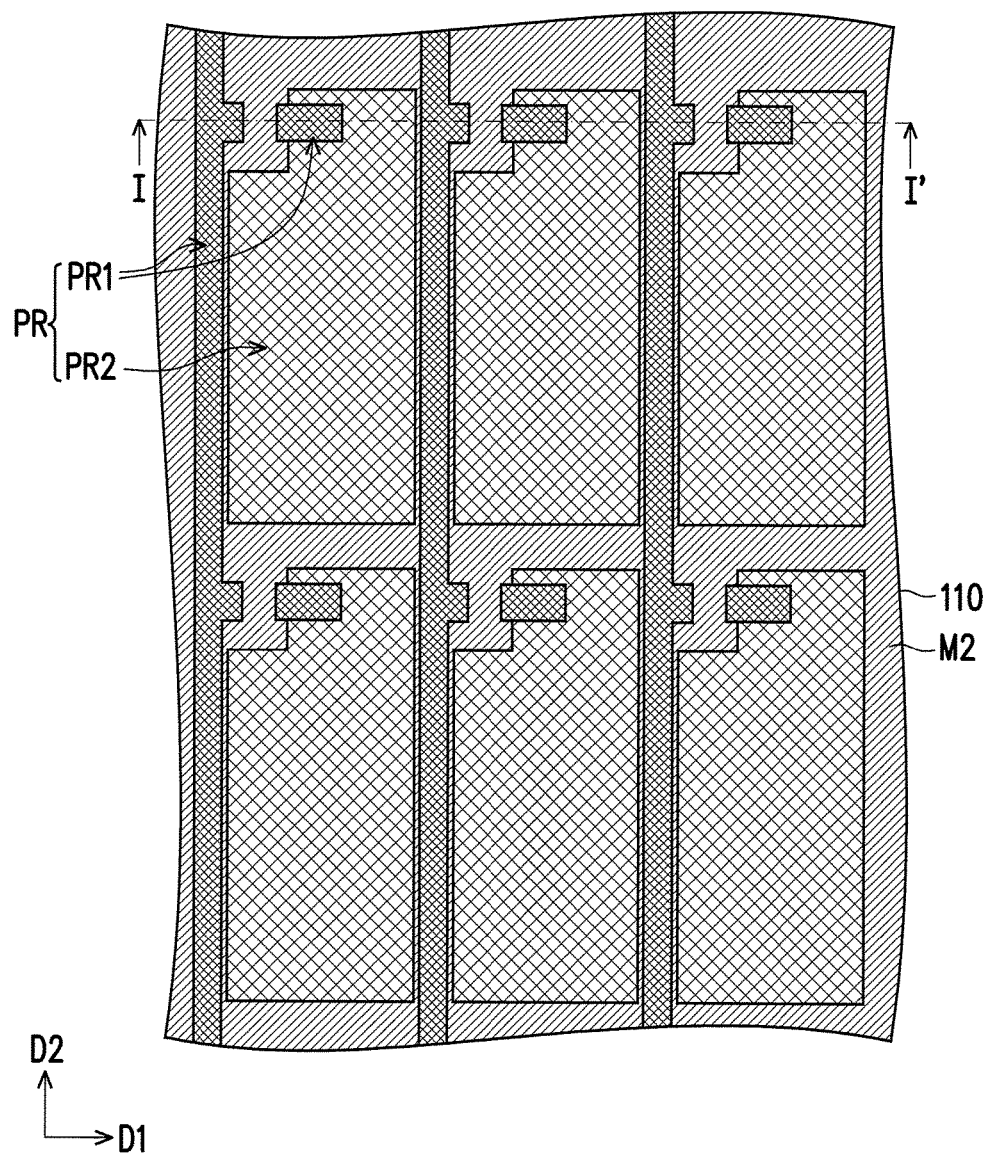
Figure 1E:
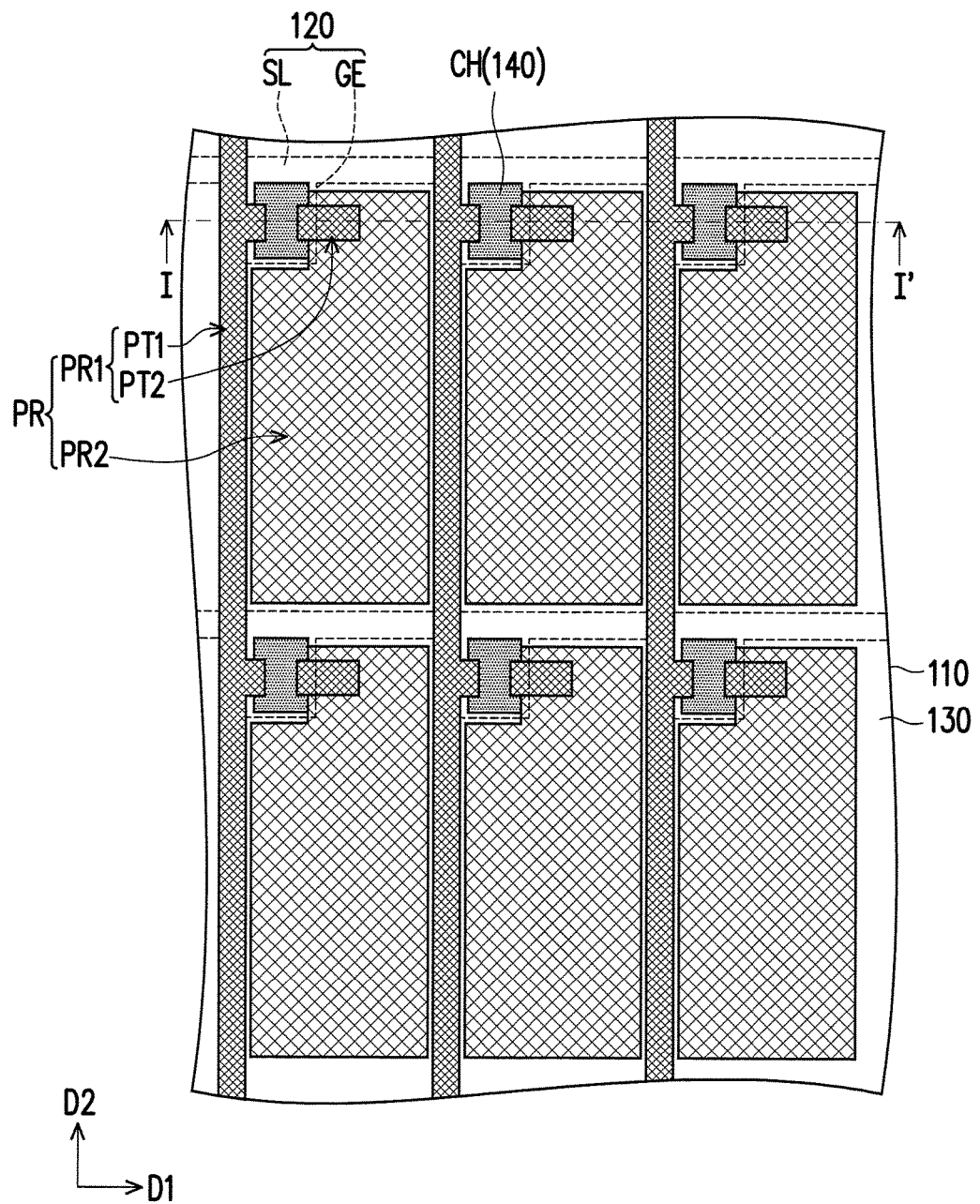
Figure 1F:
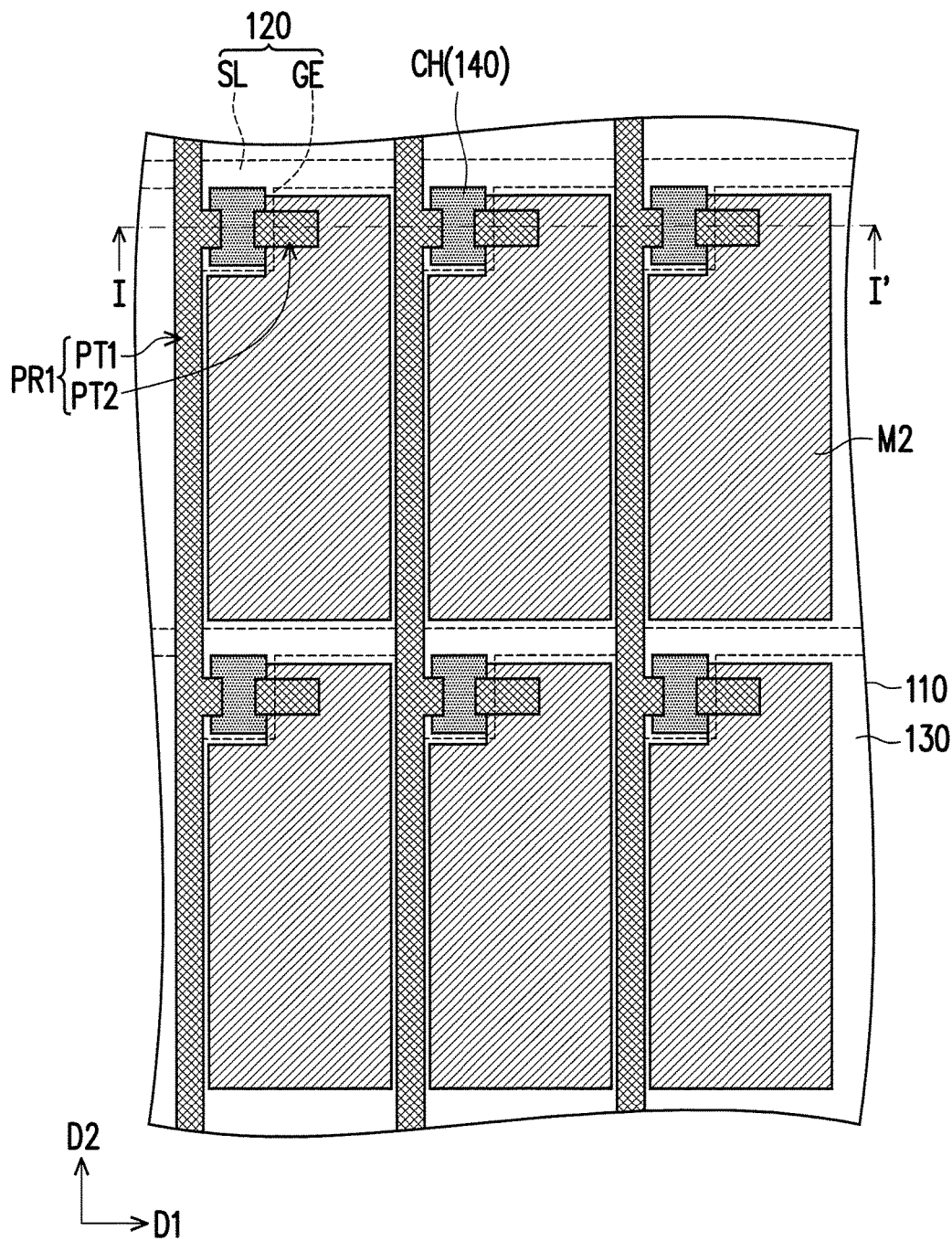
Figure 1G:
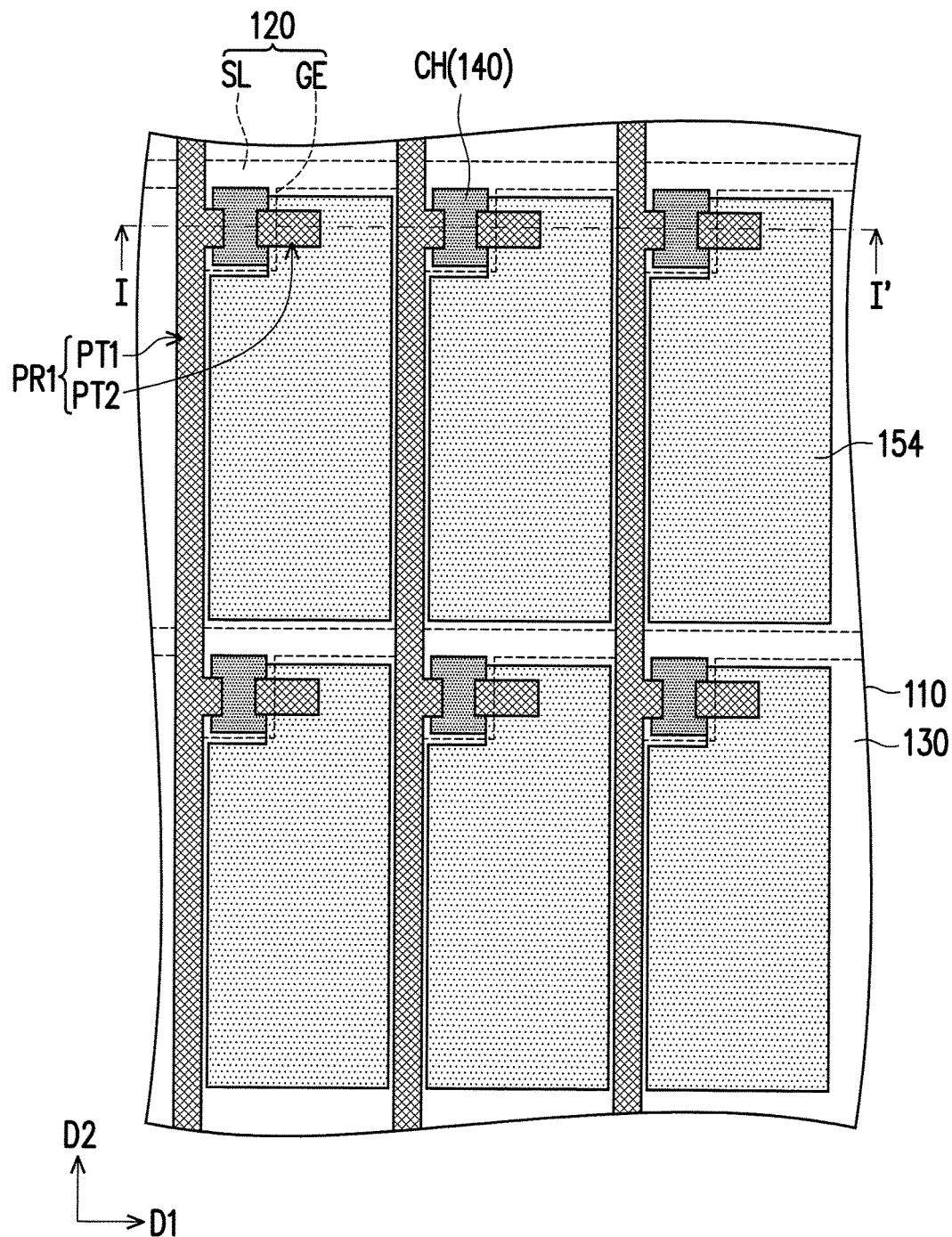
Figure 1H:
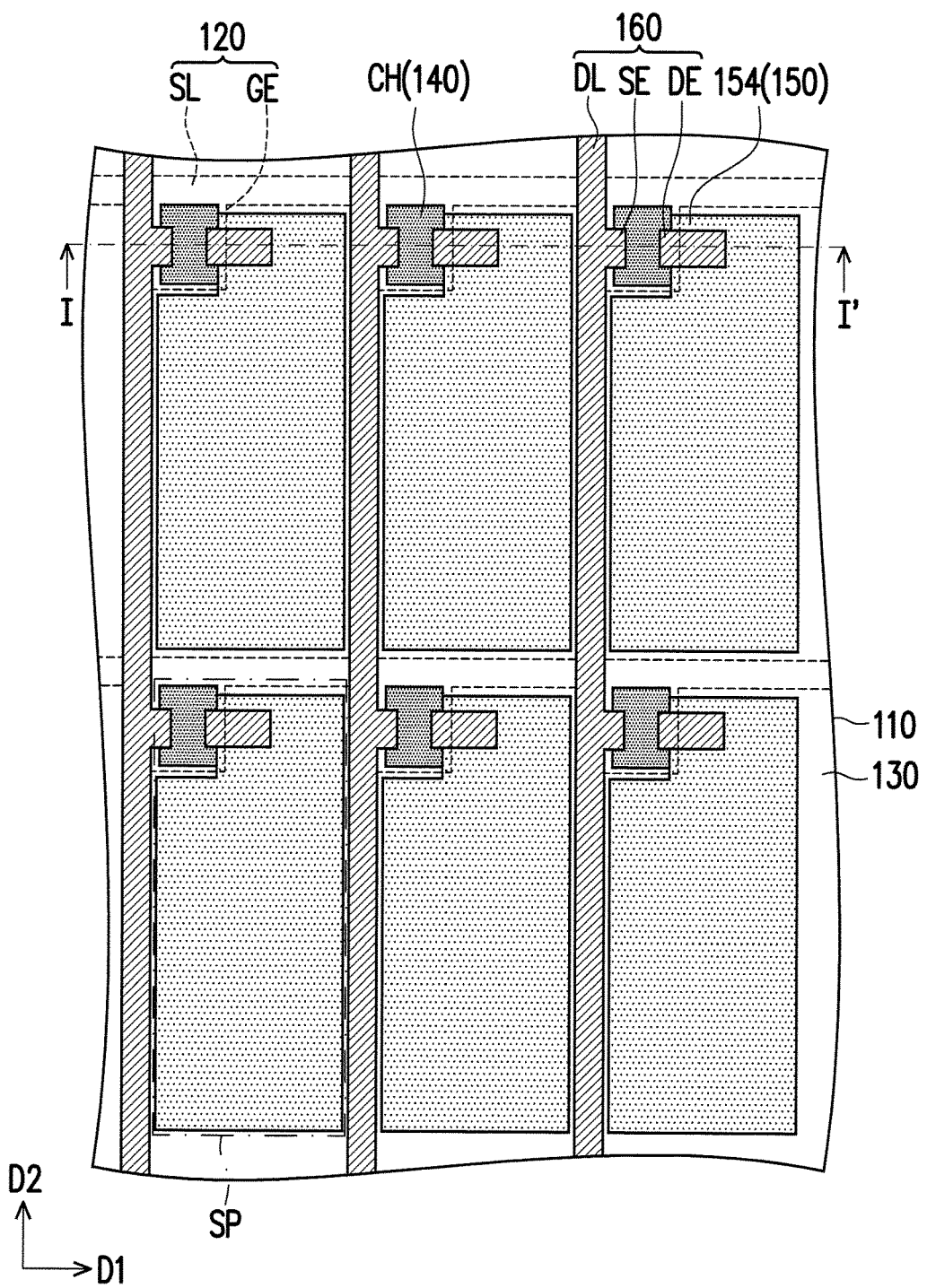
Figure 1I:
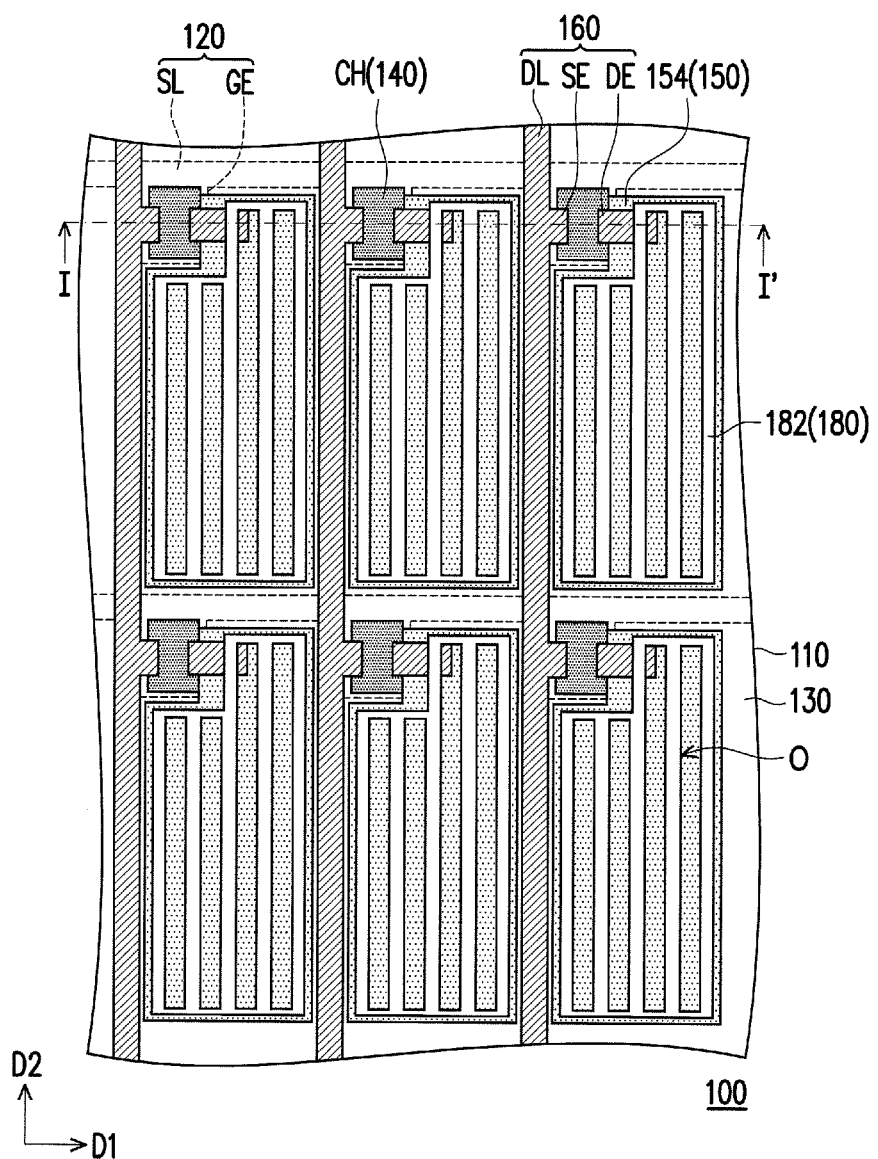

FIG. 1A through FIG. 1I are schematic partial top views illustrating a fabrication process of an active element array substrate according to a first embodiment of the disclosure, wherein a second insulation layer has been omitted in FIG. 1I so that layers under the second insulation layer can be clearly illustrated. FIG. 2A through FIG. 2I are respectively partial cross-section views along a cross-section line I-I' in FIG. 1A to FIG. 1I.

Figure 2A:
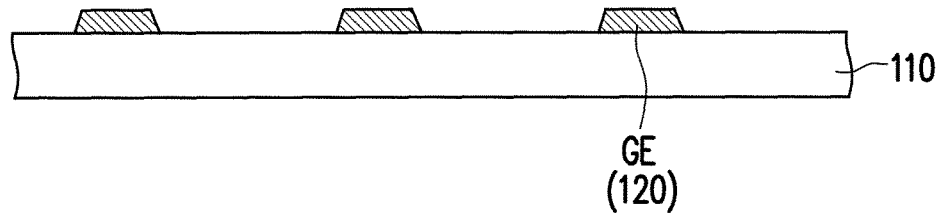
FIG. 2A through FIG. 2I are respectively partial cross-section views along a cross-section line I-I' in FIG. 1A to FIG. 1I.
Figure 2B:
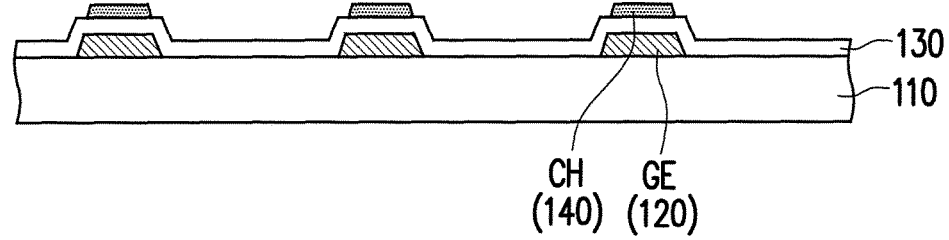
Figure 2C:
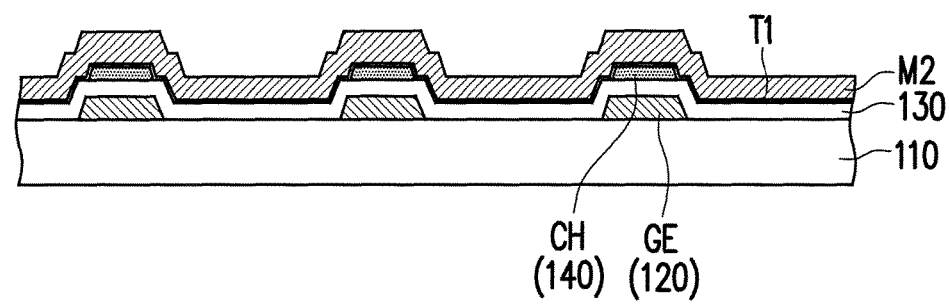
Figure 2D:
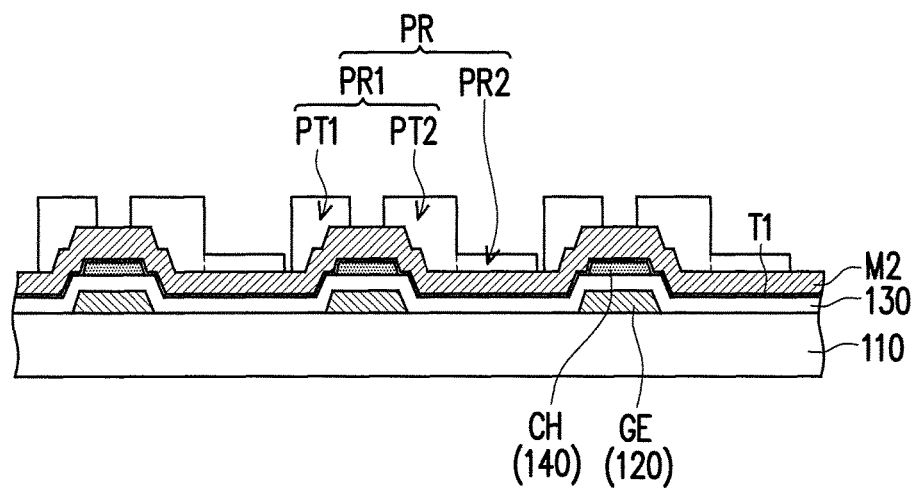
Figure 2E:
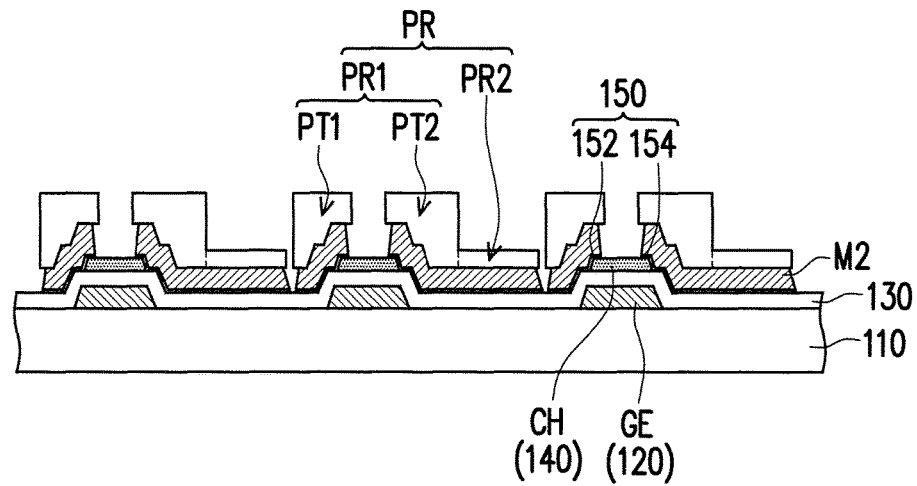
Figure 2F:
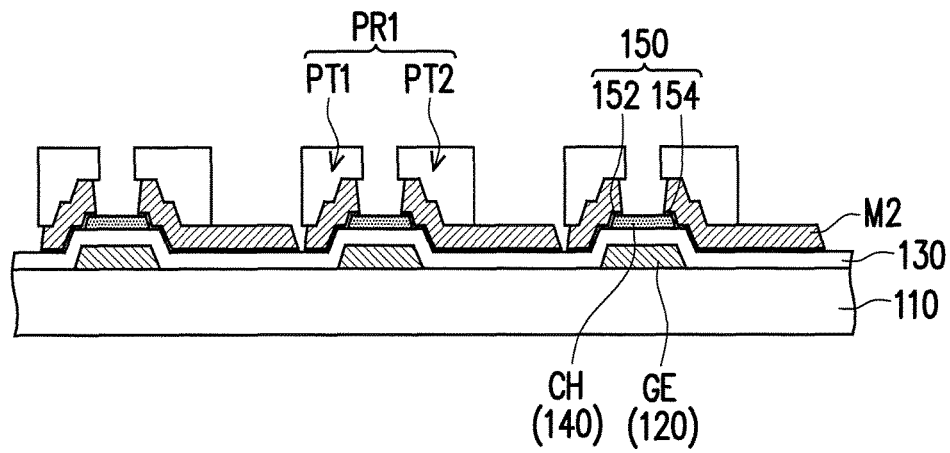
Figure 2G:
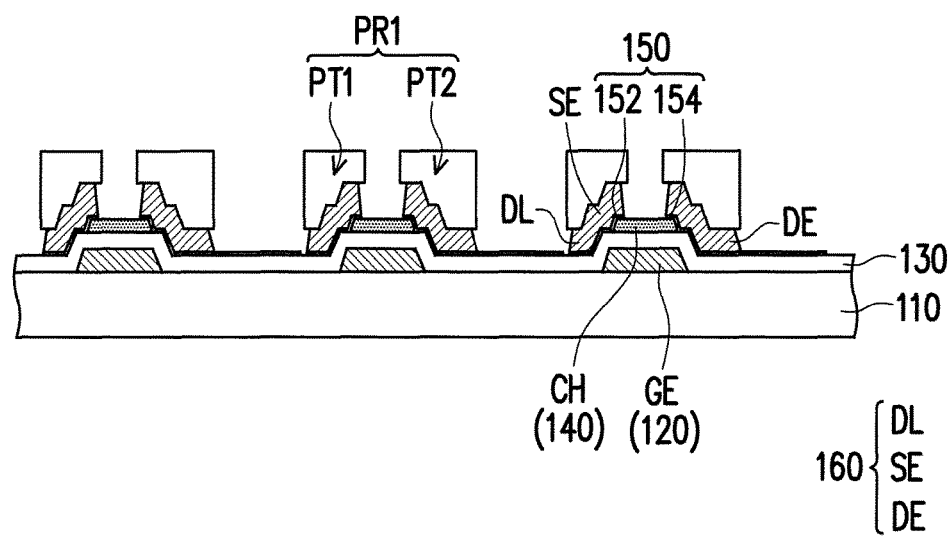
Figure 2H:
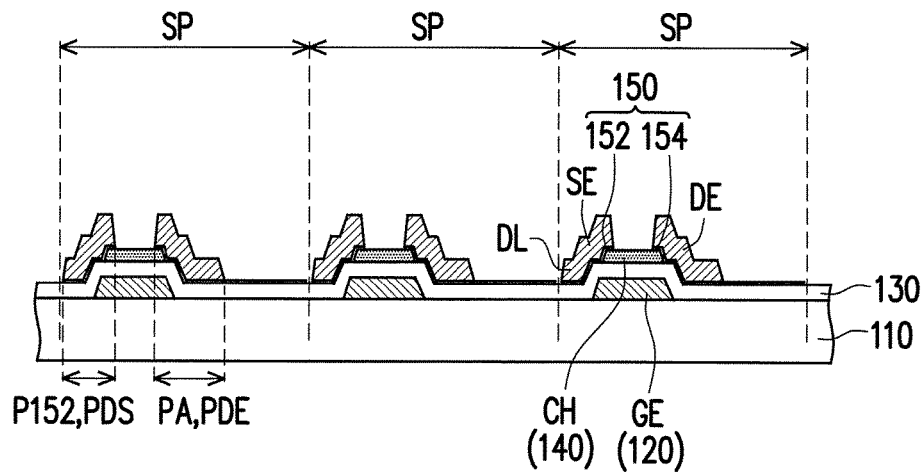
Figure 2I:
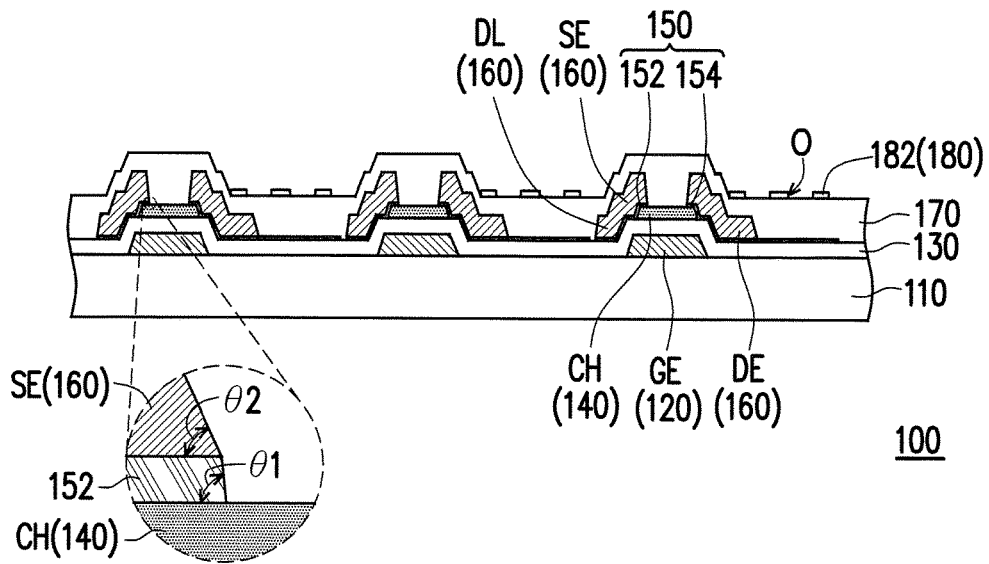

Referring to FIG. 1I and FIG. 2I, an active element array substrate 100 includes a substrate 110, a first metal layer 120, a first insulation layer 130, a semiconductor layer 140, a first patterned conductive layer 150, a second metal layer 160, a second insulation layer 170, and a second patterned conductive layer 180. The first metal layer 120 is disposed on the substrate 110. The first insulation layer 130 is located on the substrate 110 and covers the first metal layer 120. In the present embodiment, the first insulation layer 130 can further cover a partial region of the substrate 110 exposed by the first metal layer 120. The semiconductor layer 140 is disposed on the first insulation layer 130. The first patterned conductive layer 150 is disposed on the first insulation layer 130 and covers a partial region of the semiconductor layer 140. The second metal layer 160 is disposed on the first patterned conductive layer 150. The second insulation layer 170 is disposed on the second metal layer 160 and covers at least a partial region of the second metal layer 160, the first patterned conductive layer 150, the semiconductor layer 140, and the first insulation layer 130. The second patterned conductive layer 180 is disposed on the second insulation layer 170 and overlapped with the first patterned conductive layer 150. Specifically, the second patterned conductive layer 180 is overlapped with the first patterned conductive layer 150 along a direction parallel to a normal vector of a surface of the substrate 110. The active element array is disposed on the surface of the substrate 110.

FIG. 1A through FIG. 2I are used as examples in below to explain the fabrication processes of the active element array substrate 100, but the active element array substrate of the disclosure is not limited thereto. Firstly, referring to FIG. 1A and FIG. 2A, a substrate 110 is provided. A material of the substrate 110 may be glass, quartz, organic polymer or other suitable material. For example, the organic polymer can be polyimide (PI), polyethylene terephthalate (PET), or polycarbonate (PC).

The first metal layer 120 is formed on the substrate 110. A material of the first metal layer 120 may include metal or alloy. The metal is, for example, molybdenum, aluminium, molybdenum-tungsten (MoW), or copper-tungsten (CuW), but not limited thereto. The first metal layer 120 can be formed by pattering a single layer or a multi-stacked layer formed by the aforesaid metal or alloy.

In the present embodiment, the first metal layer 120 includes a plurality of scan lines SL and a plurality of gate electrodes GE. Each of the scan lines SL extends along a first direction D1, and the scan lines SL are arranged along a second direction D2, wherein the first direction D1 and the second direction D2 are intersected, such as, perpendicular to each other, but not limited thereto. Each of the gate electrodes GE is connected with one of the scan lines SL, and the gate electrodes GE are arranged at intervals along the first direction D1.

Referring to FIG. 1B and FIG. 2B, a first insulation layer 130 is firstly formed on the substrate 110, wherein the first insulation layer 130 covers the first metal layer 120 and a partial region of the substrate 110 exposed by the first metal layer 120. The first insulation layer 130 can be an organic material layer, an inorganic material layer or a stacked layer formed by any two of the above. The inorganic material layer can include a silicon oxide layer, a silicon nitride layer, a silicon oxynitride layer or a stacked layer formed by any two of the above.

The semiconductor layer 140 is formed on the first insulation layer 130. The semiconductor layer 140 can be an amorphous silicon semiconductor layer or an indium gallium zinc oxide semiconductor layer. In the present embodiment, the semiconductor layer 140 includes a plurality of semiconductor patterns CH, and each of the semiconductor patterns CH is located above one of the gate electrodes GE.

Referring to FIG. 1C and FIG. 2C, a first conductive layer T1 is formed on the substrate 110. A material of the first conductive layer T1 may include metal oxide, such as indium tin oxide (ITO), indium tin zinc oxide (ITZO), indium gallium zinc oxide (IGZO), or indium zinc oxide (IZO), but not limited thereto. In the present embodiment, the first conductive layer T1 is a transparent conductive layer. The first conductive layer T1 is not limited to be a single layer. Specifically, the first conductive layer T1 can be a metal oxide layer or a stacked layer of metal oxide. It should be noted that "transparent" does not necessarily mean 100% transmittance but most likely more than 75% transmittance.

A metal layer M2 is formed on the first conductive layer T1. A material of the metal layer M2 may include metal or alloy. The metal may, for example, be copper, but not limited thereto. The metal layer M2 can be a single layer or a multi-stacked layer formed by the aforesaid metal or alloy.

Since the semiconductor patterns CH are already being covered by the first conductive layer T1 when forming the metal layer M2, the first conductive layer T1 can protect the semiconductor patterns CH or prevent metal impurities from infiltrating the semiconductor patterns CH to cause a negative impact on the electrical properties of electrical components.

Referring to FIG. 1D and FIG. 2D, a patterned photoresist layer PR is formed on the metal layer M2. A method of foaming the patterned photoresist layer PR is, for example, to form a photoresist layer (not shown) on the surface of the metal layer M2, and then use a grayscale mask (not shown) to perform an expose process, a development process and other process on the photoresist layer. In the present embodiment, the patterned photoresist layer PR includes a plurality of first photoresist patterns PR1 and a plurality of second photoresist patterns PR2, wherein a thickness of the first photoresist patterns PR1 is greater than a thickness of the second photoresist patterns PR2. The first photoresist patterns PR1 and the second photoresist patterns PR2 are used to define the first patterned conductive layer 150 and the second metal layer 160 that are to be formed subsequently.

Referring to FIG. 1E and FIG. 2E, by using the first photoresist patterns PR1 and the second photoresist patterns PR2 as masks, the metal layer M2 exposed by the patterned photoresist layer PR and the first conductive layer T1 thereunder are removed, so as to form the first patterned conductive layer 150. A method of removing the metal layer M2 and the first conductive layer T1 can be wet etching. For instance, if the material of the metal layer M2 is copper and the material of the first conductive layer T1 is indium zinc oxide, then keto acids, which will react with the metal layer M2 but not with the semiconductor layer 140, and oxalic acids, which will react with the first conductive layer T1, can be selected as etchant. By adjusting an etching ratio between the keto acid and the oxalic acid, the metal layer M2 exposed by the patterned photoresist layer PR and the first conductive layer T1 thereunder can be effectively removed, and the damage to the semiconductor layer 140 by the etchant can also be lowered. Based on the use of different materials for the metal layer M2 and the first conductive layer T1, the selection of etchant and its composition may also be different, and are not limited to the ones mentioned in the above.

The first patterned conductive layer 150 may include a plurality of first patterns 152 and a plurality of second patterns 154, wherein the first patterns 152 are defined by first portions PT1 of the first photoresist patterns PR1, and the second patterns 154 are defined by second portions PT2 of the first photoresist patterns PR1 and the second photoresist patterns PR2. As shown in FIG. 2E, the first patterns 152 and the second patterns 154 respectively extend onto the semiconductor patterns CH and cover partial regions of the semiconductor patterns CH.

Referring to FIG. 1F and FIG. 2F, the second photoresist patterns PR2 are removed to expose the metal layer M2 under the second photoresist patterns PR2. A method of removing the second photoresist patterns PR2 can be dry etching, but not limited thereto.

Referring to FIG. 1G through FIG. 1H and FIG. 2G through FIG. 2H, by using the first photoresist patterns PR1 as masks, the metal layer M2 exposed by the first photoresist patterns PR1 is removed to form the second metal layer 160. The method of removing the metal layer M2 can be wet etching. For instance, if the material of the metal layer M2 is copper, then the keto acid, which will react with the metal layer M2 but not with the semiconductor layer 140, can be selected as the etchant to lower the damage to the semiconductor layer 140, but the selection of the etchant is not limited thereto.

The first photoresist patterns PR1 are removed to expose the second metal layer 160. In the present embodiment, the second metal layer 160 includes a plurality of data lines DL, a plurality of source electrodes SE and a plurality of drain electrodes DE. Each of the data lines DL extends along the second direction D2, and the data lines DL are arranged along the first direction D1. The data lines DL and the scan lines SL are interlaced to define a plurality of sub-pixels SP (only one sub-pixel SP is schematically illustrated in FIG. 1H). Though one sub-pixel SP in FIG. 1H is schematically located in a region defined by two of the data lines DL and two of the scan lines SL, the sub-pixel SP should not be strictly confined in that region. Instead, each of the sub-pixels SP should be interpreted as a unit which is capable of controlling the passing of light or the emitting of light, and its layout/shape can have a variety of possibilities. In one embodiment of the disclosure, a gate electrode corresponding to one sub-pixel crosses two adjacent regions, and each of the regions is defined by two of the data lines DL and two of the scan lines SL. Each of the source electrodes SE is corresponding to one of the sub-pixels SP and connected with the corresponding data line DL, wherein each of the data lines DL and the source electrode SE connected therewith are located on one of the first patterns 152, and orthogonal projections P152 of the first patterns 152 on the substrate 110 are overlapped with orthogonal projections PDS of the data lines DL and the source electrodes SE on the substrate 110. Orthogonal projections (not shown in FIG. 2H) of the second patterns 154 are overlapped with orthogonal projections PDE of the drain electrodes DE on the substrate 110. Specifically, in one of the sub-pixels SP, an orthogonal projection PA of an overlapping area of the drain electrode DE and the second pattern 154 on the substrate 110 is substantially identical to an orthogonal projection PDE of the drain electrode DE on the substrate 110. The orthogonal projections being substantially identical means that the orthogonal projections are almost completely overlapped (or completely overlapped), shapes of the orthogonal projections are almost identical (or completely identical), or sizes of the orthogonal projections are almost the same (or the same). The aforementioned "sizes being almost the same" means that the sizes being relatively close. Specifically, according to the different etchant being used, the sizes of the orthogonal projections can be the same or slightly different. In the present embodiment, in one of the sub-pixels, a projection area of the first patterned conductive layer 150 on the substrate 110 is greater than a projection area of the drain electrode DE on the substrate 110, and the projection area of the drain electrode DE on the substrate 110 falls within a range of the projection area of the first patterned conductive layer 150 on the substrate 110.

Each of the drain electrodes DE is corresponding one of the sub-pixels SP and is disposed opposite to the corresponding source electrode SE. In each of the sub-pixels SP, the source electrode SE covers the first patterns 152. The drain electrodes DE cover the second patterns 154.

Since the active element array substrate 100 can use one photomask (such as the aforesaid grayscale mask) to form the first patterned conductive layer 150 and the second metal layer 160, the active element array substrate 100 of the present embodiment can reduce the number of the photomask required for the fabrication process, thereby lowering the fabrication cost of a display panel that adopts the active element array substrate 100.

Referring to FIG. 1I and FIG. 2I, the second insulation layer 170 is formed on the substrate 110. The second insulation layer 170 covers the second metal layer 160, the first patterned conductive layer 150 exposed by the second metal layer 160, and the semiconductor layer 140 and the first insulation layer 130 exposed by the first patterned conductive layer 150. The second insulation layer 170 can be an organic material layer, an inorganic material layer or a stacked layer formed by the above two. The inorganic material layer may include a silicon oxide layer, a silicon nitride layer, a silicon oxynitride layer or a stacked layer formed by any two of the above.

The second patterned conductive layer 180 is formed on the second insulation layer 170. A material of the second patterned conductive layer 180 may include metal oxide, such as indium tin oxide, indium tin zinc oxide, indium gallium zinc oxide, or indium zinc oxide, but not limited thereto. In the present embodiment, the second patterned conductive layer 180 is a transparent conductive layer. In addition, the second patterned conductive layer 180 is not limited to be a single layer. Specifically, the second patterned conductive layer 180 can be a metal oxide layer or a stacked layer of metal oxide. The second patterned conductive layer 180 can be formed by firstly forming a second conductive layer on the second insulation layer 170 and then performing a patterning process.

In the present embodiment, the second patterned conductive layer 180 includes a plurality of third patterns 182, and the third patterns 182 are disposed corresponding to the second patterns 154 of the first patterned conductive layer 150. Specifically, each of the second patterns 154 is corresponding to one of the sub-pixels SP, and each of the third patterns 182 is corresponding to one of the sub-pixels SP and located above one of the second patterns 154. Using a fringe field switching pixel structure for an example, the second patterned conductive layer 180 may include a plurality of slits or openings. Specifically, each of the third patterns 182 may have a plurality of openings O (slits), and each third pattern 182 may use the openings O (slits) to generate an electric field with the corresponding second pattern 154. More specifically, in one of the sub-pixels SP, the second pattern 154 and the third pattern 182 receive respectively different voltages.

In addition, a base angle $\theta 2$ of the second metal layer 160 is smaller than a base angle $\theta 1$ of the first patterned conductive layer 150. For instance, a range of the base angle $\theta 2$ is from 20 degrees to 60 degrees, and a range of the base angle $\theta 1$ is from 75 degrees to 90 degrees. Preferably, the range of the base angle $\theta 2$ is from 30 degrees to 40 degrees, and the range of the base angle $\theta 1$ is from 85 degrees to 90 degrees. The base angle of the second metal layer 160 is smaller, and a hypotenuse slope thereof is less steep, and thus enables the subsequently formed layer (such as the second patterned conductive layer 180) to become less liable to breakage; and the base angle of the first patterned conductive layer 150 is large, and thus, in addition to preventing a generation of dark fringe at the inclined portion, a channel region of a transistor device may also maintain its channel length so that electrical properties can be stabilized.

In the present embodiment, as shown in FIG. 1H, one of the gate electrodes GE, one of the semiconductor patterns CH, one of the first patterns 152, one of the second patterns 154, one of the source electrodes SE, one of the drain electrodes DE, and one of the third patterns 154 are corresponding to one of the sub-pixels SP, wherein the first patterns 152 and the second patterns 154 respectively extend onto the semiconductor patterns CH, the source electrodes SE cover the first patterns 152, the drain electrodes DE cover the second patterns 154. In addition, the shape of each of the sub-pixels SP is rectangular. However, the shape of the sub-pixels SP, and the number and the shape of each component and the relative positional relationship between the components in each of the sub-pixels SP, can be changed according to the needs, and are not limited to the ones illustrated in FIG. 1I and FIG. 2I.

Figure 3:
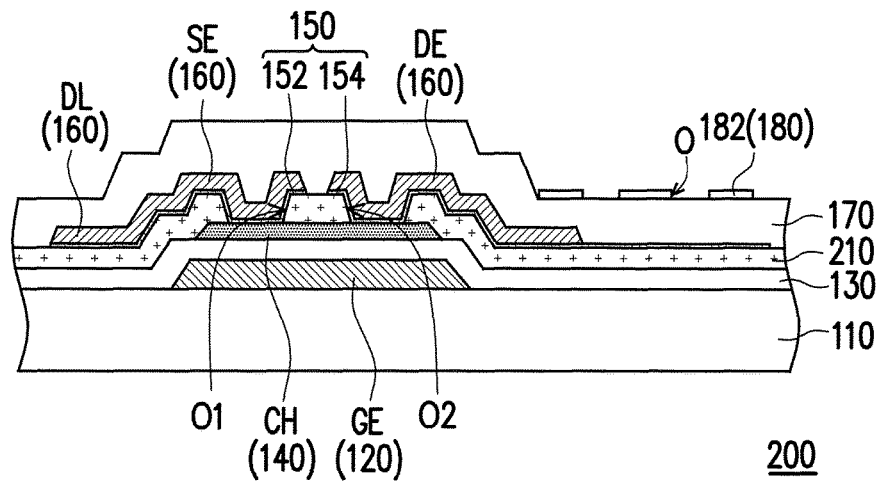
FIG. 3 is a partial cross-section view illustrating an active element array substrate according to a second embodiment of the disclosure.

FIG. 3 is a partial cross-section view illustrating an active element array substrate according to a second embodiment of the disclosure. Referring to FIG. 3, an active element array substrate 200, in addition to the substrate 110, the first metal layer 120, the first insulation layer 130, the semiconductor layer 140, the first patterned conductive layer 150, the second metal layer 160, the second insulation layer 170, and the second patterned conductive layer 180, may further include a third insulation layer 210 to protect the semiconductor layer 140. For instance, the third insulation layer 210 can be an inorganic material layer. The inorganic material layer may include a silicon oxide layer, a silicon nitride layer, a silicon oxynitride layer or a stacked layer formed by any two of the above.

The third insulation layer 210 is disposed between the semiconductor layer 140 and the first patterned conductive layer 150. The third insulation layer 210 has a plurality of first openings O1 and s a plurality of second openings O2 (only one first opening O1 and only one second opening O2 are schematically illustrated). The first openings O1 are disposed corresponding to the source electrodes SE. The second openings O2 are disposed corresponding to the drain electrodes DE. One of the first patterns 152 is in contact with the corresponding semiconductor pattern CH through one of the first openings O1, and one of the second patterns 154 is in contact with the corresponding semiconductor pattern CH through one of the second openings O2.

In the present embodiment, the active element array substrate 200 may also employ one photomask to form the first patterned conductive layer 150 and the second metal layer 160. Therefore, the active element array substrate 200 of the present embodiment can reduce the number of the photomask being required, thereby lowering the fabrication cost of a display panel that adopts the active element array substrate 200.

Figure 4:
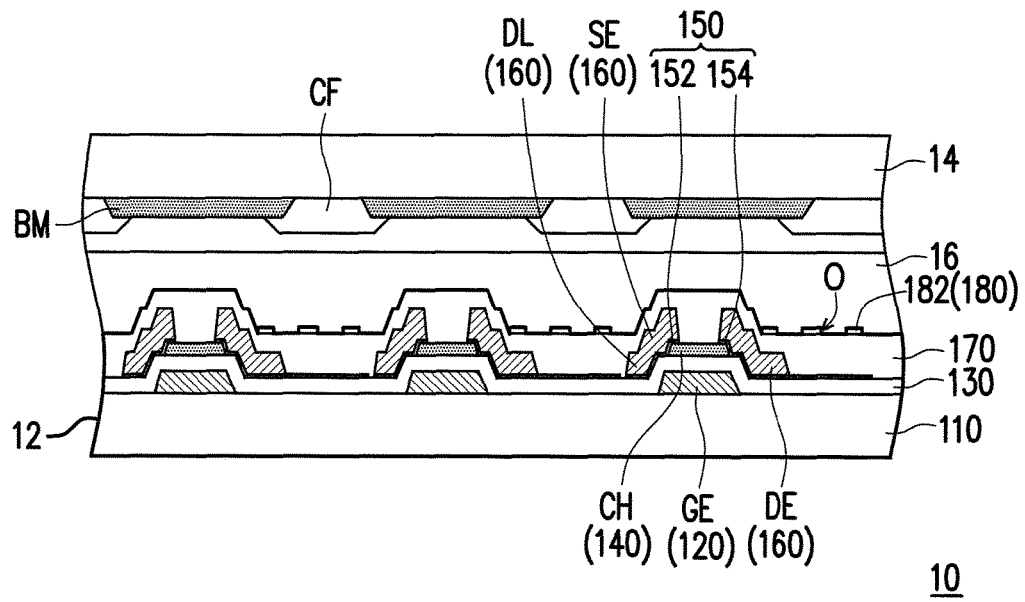
FIG. 4 is a partial cross-section view illustrating a display panel according to an embodiment of the disclosure.

FIG. 4 is a partial cross-section view illustrating a display panel according to an embodiment of the disclosure. Referring to FIG. 4, a display panel 10 include an active element array substrate 12, an opposite substrate 14 and a display medium layer 16. The active element array substrate 12 is, for example, the active element array substrate 100 as illustrated in FIG. 2I, but not limited thereto. In another embodiment, the active element array substrate 12 may be the active element array substrate 200 as illustrated in FIG. 3. The opposite substrate 14 is opposite to the active element array substrate 12. The display medium layer 16 is located between the active element array substrate 12 and the opposite substrate 14.

A material of the opposite substrate 14 may be glass, quartz, organic polymer or other suitable material. The display medium layer 16 can be a liquid crystal layer. By adjusting a voltage difference between the second patterns 154 and the third patterns 182, an orientation of liquid crystal molecules in the liquid crystal layer can be controlled, so as to adjust a greyscale level of the display image.

According to different design requirements, the display panel 10 may further include other layers. For instance, the display panel 10 may further include a black matrix layer BM to shield the components in the display panel 10 which are not desired to be seen, such as the scan lines SL, the data lines DL, the active elements (constituted by the gate electrodes GE, the semiconductor patterns CH, the source electrodes SE and the drain electrodes DE) or other wirings that are not shown in FIG. 1I. In addition, the display panel 10 may also further include a color filter layer CF to provide a color display image. In another embodiment, the black matrix layer BM and the color filter layer CF may be disposed on the active element array substrate 12.

In summary, the present embodiment can employ one photomask to form the first patterned conductive layer and the second metal layer. The active element array substrate of the present embodiment can reduce the number of the photomask being required, thereby lowering the fabrication costs of a display panel that adopts this active element array substrate.

The present disclosure has described several embodiments. The technical features described in those embodiments can be picked, selected, and mixed to form another embodiment. For example, the technical features described in the first embodiment can also be applied to the second embodiment.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An active element array substrate, comprising:
   a substrate;
   a first metal layer, disposed on the substrate;
   a first insulation layer, located on the substrate and covering the first metal layer;
   a semiconductor layer, disposed on the first insulation layer;
   a first patterned conductive layer, disposed on the first insulation layer and covering a partial region of the semiconductor layer;
   a second metal layer, disposed on the first patterned conductive layer;
   a second insulation layer, disposed on the second metal layer and covering at least a partial region of the second metal layer, the first patterned conductive layer, the semiconductor layer, and the first insulation layer; and
   a second patterned conductive layer, disposed on the second insulation layer and overlapped with the first patterned conductive layer,
   wherein the first metal layer comprises a plurality of scan lines and a plurality of gate electrodes, the semiconductor layer comprises a plurality of semiconductor patterns, the second metal layer comprises a plurality of data lines, a plurality of source electrodes and a plurality of drain electrodes, the data lines and the scan lines are interlaced to define a plurality of sub-pixels, the first patterned conductive layer comprises a plurality of first patterns and a plurality of second patterns, wherein orthogonal projections of the first patterns on the substrate are overlapped with orthogonal projections of the data lines and the source electrodes on the substrate, and orthogonal projections of the second patterns are overlapped with orthogonal projections of the drain electrodes on the substrate.

2. The active element array substrate as recited in claim 1, wherein, in one of the sub-pixels, an orthogonal projection of an overlapping area of the drain electrode and the second pattern on the substrate is substantially identical to an orthogonal projection of the drain electrode on the substrate.

3. The active element array substrate as recited in claim 1, wherein the second patterned conductive layer comprises a plurality of third patterns, each of the second patterns is corresponding to one of the sub-pixels, and each of the third patterns is corresponding to one of the sub-pixels and located above one of the second patterns.

4. The active element array substrate as recited in claim 1, wherein one of the gate electrodes, one of the semiconductor patterns, one of the first patterns, one of the second patterns, one of the source electrodes, one of the drain electrodes, and one of the third patterns are corresponding to one of the sub-pixels, wherein the one of the first patterns and the one of the second patterns respectively extend onto the one of the semiconductor patterns, the one of the source electrodes covers the one of the first patterns, and the one of the drain electrodes covers the one of the second patterns.

5. The active element array substrate as recited in claim 1, further comprising:
a third insulation layer, disposed between the semiconductor layer and the first patterned conductive layer, wherein the third insulation layer has a plurality of first openings and a plurality of second openings, the first openings are disposed corresponding to the source electrodes, the second openings are disposed corresponding to the drain electrodes, one of the first patterns is in contact with the corresponding semiconductor pattern through one of the first openings, and one of the second patterns is in contact with the corresponding semiconductor pattern through one of the second openings.

6. The active element array substrate as recited in claim 1, wherein the semiconductor layer includes amorphous silicon or indium gallium zinc oxide, and the first patterned conductive layer includes metal oxide.

7. The active element array substrate as recited in claim 1, wherein a base angle of the second metal layer is smaller than a base angle of the first patterned conductive layer.

8. The active element array substrate as recited in claim 1, wherein the first patterned conductive layer and the second patterned conductive layer are transparent conductive layers respectively.

9. The active element array substrate as recited in claim 1, wherein the second patterned conductive layer includes a plurality of slits or openings.

10. A display panel, comprising:
an active element array substrate, comprising a substrate, a first metal layer, a first insulation layer, a semiconductor layer, a first patterned conductive layer, a second metal layer, a second insulation layer and a second patterned conductive layer, wherein the first metal layer is disposed on the substrate, the first insulation layer is located on the substrate and covers the first metal layer, the semiconductor layer is disposed on the first insulation layer, the first patterned conductive layer is disposed on the first insulation layer and covers a partial region of the semiconductor layer, the second metal layer is disposed on the first patterned conductive layer, the second insulation layer is disposed on the second metal layer and covers at least a partial region of the second metal layer, the first patterned conductive layer, the semiconductor layer, and the first insulation layer, and the second patterned conductive layer is disposed on the second insulation layer and overlapped with the first patterned conductive layer;
an opposite substrate, being opposite to the active element array substrate; and
a display medium layer, located between the active element array substrate and the opposite substrate,
wherein the first metal layer comprises a plurality of scan lines and a plurality of gate electrodes, the semiconductor layer comprises a plurality of semiconductor patterns, the second metal layer comprises a plurality of data lines, a plurality of source electrodes and a plurality of drain electrodes, the data lines and the scan lines are interlaced to define a plurality of sub-pixels, the first patterned conductive layer comprises a plurality of first patterns and a plurality of second patterns, wherein orthogonal projections of the first patterns on the substrate are overlapped with orthogonal projections of the data lines and the source electrodes on the substrate, and orthogonal projections of the second patterns on the substrate are overlapped with orthogonal projection of the drain electrodes on the substrate.

11. The display panel as recited in claim 10, wherein, in one of the sub-pixels, an orthogonal projection of an overlapping area of the drain electrode and the second pattern on the substrate is substantially identical to an orthogonal projection of the drain electrode on the substrate.

12. The display panel as recited in claim 10, wherein the second patterned conductive layer comprises a plurality of third patterns, each of the second patterns is corresponding to one of the sub-pixels, and each of the third patterns is corresponding to one of the sub-pixels and located above one of the second patterns.

13. The display panel as recited in claim 10, wherein one of the gate electrodes, one of the semiconductor patterns, one of the first patterns, one of the second patterns, one of the source electrodes, one of the drain electrodes, and one of the third patterns are corresponding to one of the sub-pixels, wherein the one of the first patterns and the one of the second patterns respectively extend onto the one of the semiconductor patterns, the one of the source electrodes covers the one of the first patterns, and the one of the drain electrodes covers the one of the second patterns.

14. The display panel as recited in claim 10, wherein the active element array substrate further comprises a third insulation layer, the third insulation layer is disposed between the semiconductor layer and the first patterned conductive layer, and the third insulation layer has a plurality of first openings and a plurality of second openings, the first openings are disposed corresponding to the source electrodes, the second openings are disposed corresponding to the drain electrodes, one of the first patterns is in contact with the corresponding semiconductor pattern through one of the first openings, and one of the second patterns is in contact with the corresponding semiconductor pattern through one of the second openings.

15. The display panel as recited in claim 10, wherein the semiconductor layer includes amorphous silicon or an indium gallium zinc oxide, and the first patterned conductive layer includes metal oxide.

16. The display panel as recited in claim 10, wherein a base angle of the second metal layer is smaller than a base angle of the first patterned conductive layer.

17. The display panel as recited in claim 10, wherein the first patterned conductive layer and the second patterned conductive layer are transparent conductive layers respectively.

18. The display panel as recited in claim 10, wherein the second patterned conductive layer includes a plurality of slits or openings.

* * * * *